US006897561B2

(12) United States Patent
Nemtsev et al.

(10) Patent No.: US 6,897,561 B2
(45) Date of Patent: May 24, 2005

(54) SEMICONDUCTOR POWER DEVICE HAVING A DIAMOND SHAPED METAL INTERCONNECT SCHEME

(75) Inventors: Gennadiy Nemtsev, Stoughton, MA (US); Hui Wang, North Kingstown, RI (US); Yingping Zheng, North Kingstown, RI (US); Rajesh Nair, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 56 days.

(21) Appl. No.: 10/454,870

(22) Filed: Jun. 6, 2003

(65) Prior Publication Data

US 2004/0245638 A1 Dec. 9, 2004

(51) Int. Cl.[7] .................................. H01L 23/48
(52) U.S. Cl. ...................... 257/758; 257/401; 257/774; 257/776; 438/622
(58) Field of Search .................... 257/341, 342, 257/401, 758, 774, 776; 438/622, 284, 286, 118, 269, 637, 639, 640, 667, 668, 672, 675, 700, 701, 713, 978, 280, 619

(56) References Cited

U.S. PATENT DOCUMENTS

| | | | |
|---|---|---|---|
| 4,833,513 A | 5/1989 | Sasaki | |
| 5,447,876 A | 9/1995 | Moyer et al. | |
| 5,578,840 A | 11/1996 | Scepanovic et al. | |
| 5,801,091 A | 9/1998 | Efland et al. | |
| 5,859,456 A | 1/1999 | Efland et al. | |
| 6,150,722 A | 11/2000 | Efland et al. | |
| 6,248,658 B1 * | 6/2001 | Buynoski | 438/622 |
| 6,407,434 B1 | 6/2002 | Rostoker et al. | |
| 6,462,522 B2 | 10/2002 | Burstein et al. | |
| 6,569,758 B2 * | 5/2003 | Jorger et al. | 438/620 |
| 6,624,063 B2 * | 9/2003 | Hasegawa et al. | 438/623 |
| 6,686,241 B2 * | 2/2004 | Ati et al. | 438/257 |
| 6,713,823 B1 * | 3/2004 | Nickel | 257/401 |

* cited by examiner

*Primary Examiner*—David Nelms
*Assistant Examiner*—Long Tran
(74) *Attorney, Agent, or Firm*—Kevin B. Jackson

(57) ABSTRACT

A transistor (10) is formed as a matrix of transistor cells (13) that have drain metal strips (50) for contacting drains (15) of the transistor cells and source metal strips (55) for contacting sources (35) of the transistor cells. An interconnect layer (1030) overlying the matrix of transistor cells has first portions (201) that contact one the drain metal strips with first and second vias (79) and second portions (101) that contact one of the source metal strips with third and fourth vias (78).

20 Claims, 5 Drawing Sheets

US 6,897,561 B2

SEMICONDUCTOR POWER DEVICE HAVING A DIAMOND SHAPED METAL INTERCONNECT SCHEME

BACKGROUND OF THE INVENTION

The present invention relates in general to semiconductor devices and, more particularly, to power transistors.

In Lateral Double Diffused Metal Oxide Semiconductor (LDMOS) power transistors, drain and source semiconductor regions are typically interdigitated regions formed on the same die surface to extend across the LDMOS transistor die, with bonding pads arranged around the die periphery. Final metal conductor regions extend across the drain and source semiconductor regions to connect the semiconductor regions to respective bonding pads. Since some of the current must follow the length of the drain or source region to the bonding pad, such power transistors have undesirably high on-resistance ($Rds_{ON}$).

One solution to reduce the resistance ($Rds_{ON}$) of power transistors is to have alternating metal strips formed over and coupled to source and drain semiconductor regions. A plurality of bumps is then formed on the metal strips for external connection to the source and drain regions of the power device. Since the distance between the bumps determines the distance of which current must travel from nearby source and drain regions, and minimum bump size determines the minimum metal strip width (thus spacing), and the distances current must travel is not minimized due to the constraint of bump size on current travel distance. For example, the average distance the current would travel is approximately one-half the distance between the centers of the bumps. Therefore, as resistance is proportional to the length or distance the current travels divided by the width of the metal strip, the $Rds_{ON}$ of such as device is not optimized. Furthermore, if the device size is increased, the metal strip resistance increases as the metal strips traverse a greater device width.

Another solution utilizes a three metal layer solution wherein a plurality of source and drain regions are coupled together to form the source and drain of multiple LDMOS transistors. Each diffusion region has a first metal layer strip formed over and in contact with it, and a second metal layer strip formed over a plurality of the first metal layer strips to form source and drain busses. Then a third very thick metal layer is formed over the second layer metal busses to provide reduced metal line resistance and an external electrical contact for the power device. Since the lengths of the first and second metal layer strips must both be made greater as the size of the LDMOS power transistor increases, the resistance will also increase for reasons similar to those above. Furthermore, the third layer of metal requires additional complex and costly processing over the prior mentioned two metal strip solution. Moreover, as device size increase the metal interconnect layer resistance increases proportionally, as the busses or strips must traverse the entire width of the device.

Hence, there is a need for a power transistor that operates at a high current with a low on-resistance that is relatively independent of transistor size, that has a high power dissipation, and that can be made with a simple sequence of processing steps to maintain a low manufacturing cost.

DETAILED DESCRIPTION OF THE DRAWINGS

In the figures, elements having the same reference number have similar functionality. As used herein, the term "mesh gate LDMOS" refers to a cellular transistor structure design incorporating a polysilicon gate region formed in a mesh pattern. As used herein, the terms "generally rhombus shaped" and "generally diamond shaped" refer to generally quadrilateral polygonal shapes including those having rounded corners or multiple reentrant portions, but retain a general rhombus or diamond shape.

An N-channel mesh gate lateral double diffused metal-oxide semiconductor (LDMOS) transistor structure and the related process steps will be discussed as an example. Thus conductivities, doping materials and the like are considered appropriate to an N-channel mesh gate LDMOS transistor, and it is commonly understood that by substituting materials or alternating conductivities a P-type transistor can readily be made. Furthermore, the transistor can also be formed as a stripe LDMOS transistor, vertical MOS transistor, lateral transistor or other common transistor cell design. Additionally, various commonly understood process steps, layers, regions, and features have been omitted for the purposes of simplifying the description to better describe the invention.

Figure 1:
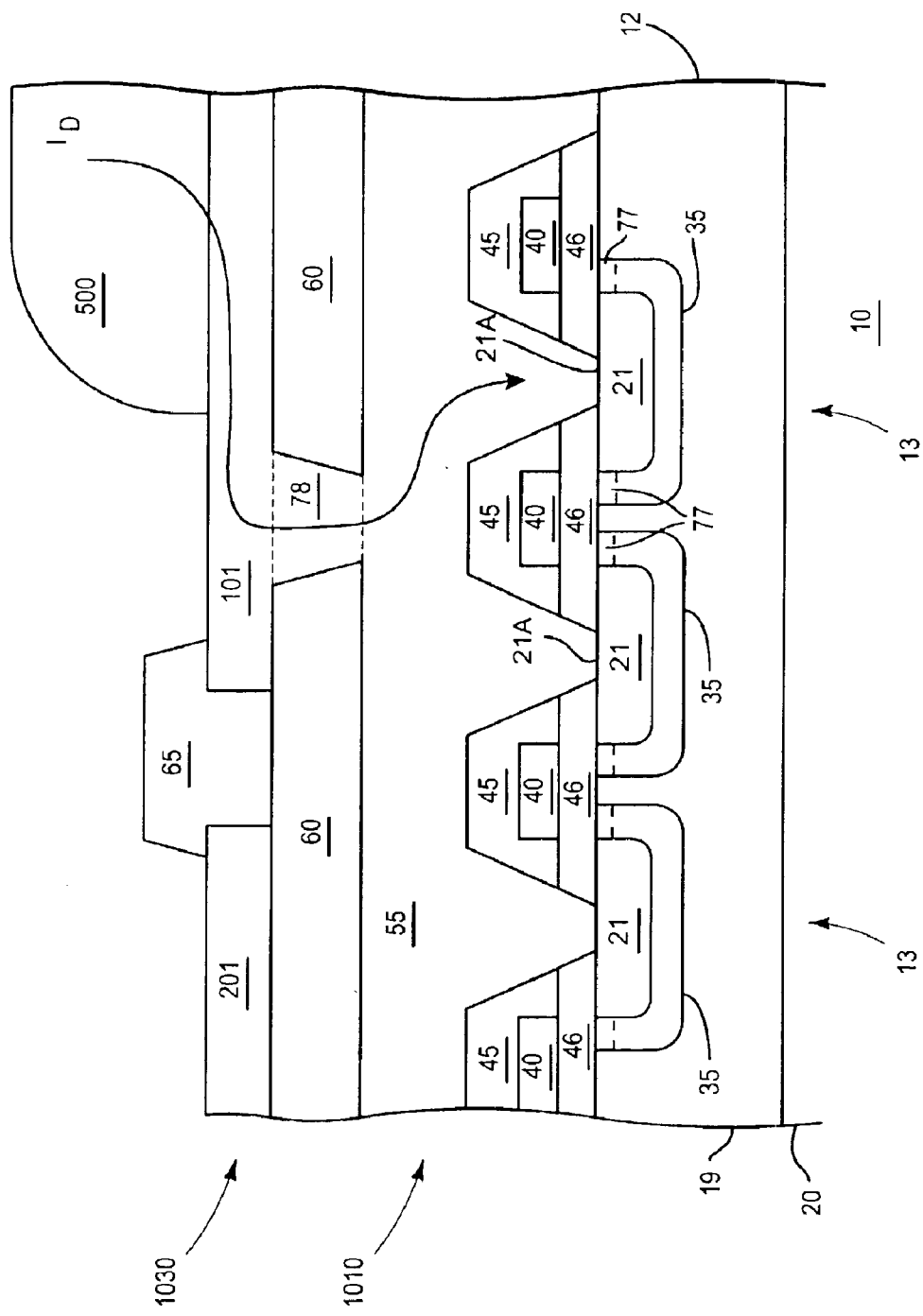
FIG. 1 is a first cross-sectional view of a transistor.

FIG. 1 is a first cross-sectional view of a transistor 10 implemented as a matrix or array of parallel-connected transistor cells 13. The first cross-sectional view shows portions of transistor cells 13 that include a substantially collinear plurality or row of sources 21 formed within body regions 35. Transistor 10 is configured as a mesh gate LDMOS power transistor on a semiconductor substrate 12.

Semiconductor substrate 12 is formed of P-type silicon material doped with boron and having an N-type epitaxial layer 19 deposited on a base layer 20. In addition, substrate 12 typically includes an N-type buried layer (not shown) formed in selected regions at the interface of base layer 20 and epitaxial layer 19.

A thin gate oxide 46 is grown on top of substrate 12. An undoped polysilicon layer is deposited on the surface of gate oxide 46 and doped to become conductive. The polysilicon layer is then patterned and dry-etched to form a control electrode mesh designated as a gate 40 of transistor 10.

A P-type doping mask (not shown) is used to expose part of polysilicon gate 40 and substrate 12, and boron is implanted using the gate 40 polysilicon as a self-aligned mask and diffused to form body regions 35.

A mask (not shown) is patterned to expose part of polysilicon gate 40 and an N-type dopant such as arsenic is implanted using the gate 40 as a self-aligned mask. The dopant is diffused to form sources 21 within body regions 35. Application of a voltage signal to gate 40 induces channels 77 to be formed adjacent to sources 21 within body regions 35 as shown.

An insulating layer 45 is then deposited over the surface of the wafer. Insulating layer 45 materials include deposited undoped oxide, boron doped oxide or silicon nitride. Insulating layer 45 is patterned and dry-etched to expose at least a portion of source 21 and gate 40 for making electrical contact.

A metal layer 1010 is then formed on substrate 12. In one embodiment, metal layer 1010 includes a thin preparatory layer of sputtered platinum followed by a thermal treatment to form an adhesion layer of platinum silicide on exposed silicon surface regions for improved adhesion of subsequently formed metal. In one embodiment, metal layer 1010 comprises a sputtered titanium tungsten and aluminum metal layer including a portion of copper. In one embodiment, the titanium tungsten layer is formed to a thickness of about 0.15 micrometers. In one embodiment the aluminum-copper is formed to a thickness of about 0.6 micrometers, and the copper content is about 0.5%.

Metal layer 1010 is patterned by dry-etch to form portions referred to as source metal strips 55 that electrically contact a plurality of sources 21.

An insulating layer 60 is deposited over the surface of the wafer. Insulating layer 60 is patterned and dry-etched to expose metal layer 1010 in selected regions to form a plurality of source metal vias 78. In one embodiment, insulating layer 60 includes layers of deposited undoped oxide layer and spin-on-glass.

A metal layer or interconnect layer 1030 is then deposited, patterned and etched to form source and drain portions 101 and 201, respectively. Source portions 101 contact source metal strips 55 through vias 78, while drain portions 201 contact drains as further described below. In one embodiment, interconnect layer 1030 comprises a thin layer of sputtered titanium-tungsten alloy and a thick layer of aluminum-copper alloy. In one embodiment interconnect layer 1030 is formed with a thickness of about 2.1 micrometers including a titanium-tungsten layer about 0.1 micrometers thick. The aluminum-copper alloy typically is formed with about 0.5% copper content.

A dielectric material is deposited and patterned to form a passivation layer 65 that protects transistor 10 while leaving source portions 101 exposed for making electrical connections. In one embodiment, passivation layer 65 includes plasma enhanced chemical vapor deposition silicon nitride formed to a thickness of about 0.68 micrometers.

A conductive material is formed on the exposed surfaces of source portions 101 of interconnect layer 1030 to form a conductive source bump 500 that extends upward from substrate 12 a distance suitable for making external electrical connections. Source bump 500 typically is formed with solder paste, conductive epoxy or may be a solder or copper bump ball. When a signal voltage applied to gate 40 forms channels 77, a transistor current $I_D$ flows from source bumps 500 through source portions 101 of interconnect layer 1030, vias 78 and source metal strips 55 to sources 21 for routing through channels 77.

Figure 2:
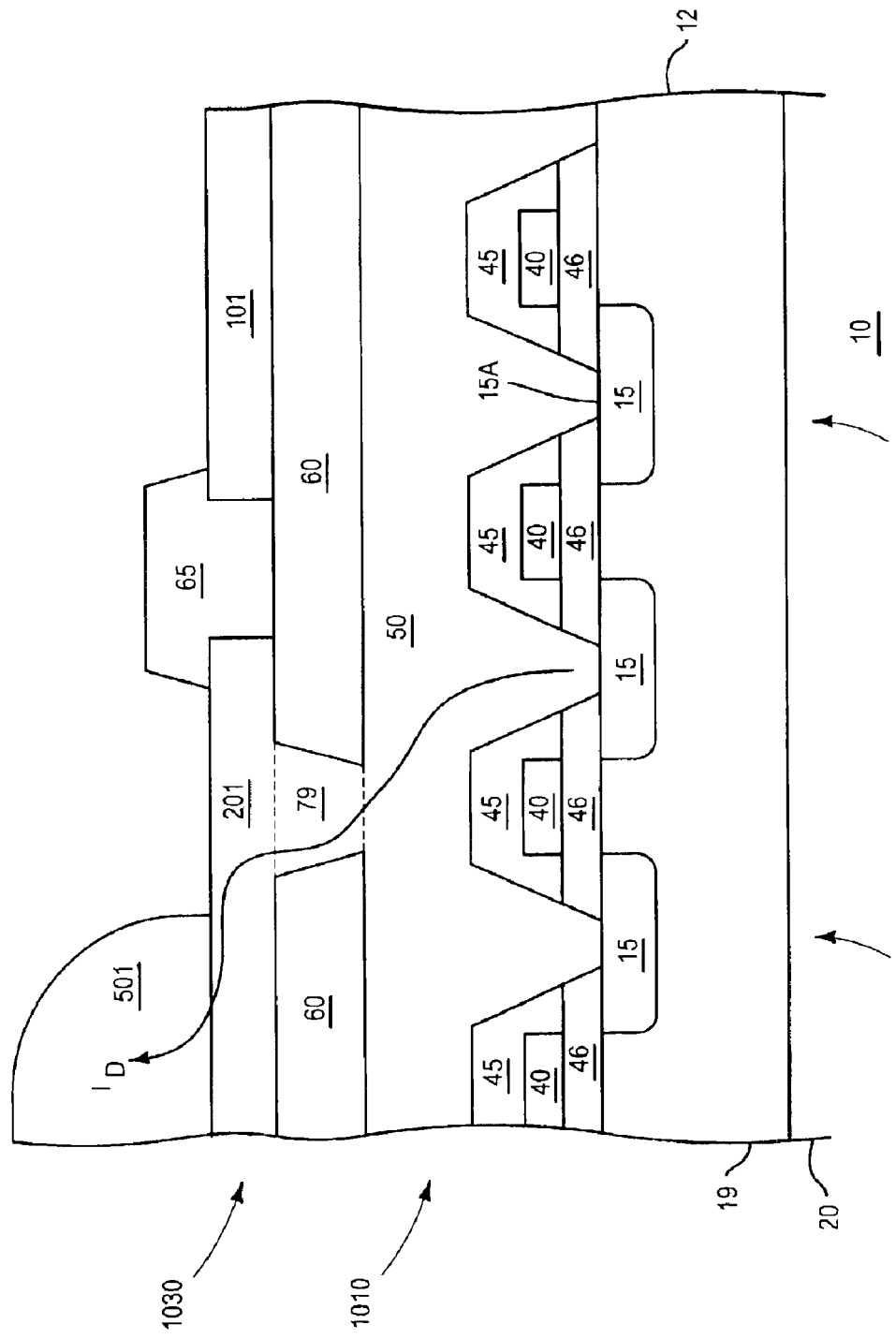
FIG. 2 is a second cross-sectional view of the transistor.

FIG. 2 is a second cross-sectional view of transistor 10 showing portions of transistor cells 13 along a plane that include a substantially collinear plurality or row of drains 15. Drains 15 are patterned, implanted and diffused concurrently with sources 21.

During the formation of source metal strips 55, metal layer 1010 is patterned and etched to form drain metal strips 50 for contacting drains 15 at drain contacts 15A. Recall that interconnect layer 1030 is patterned with portions 101 that are electrically coupled to source metal strips 55 through source vias 78. Concurrently, interconnect layer 1030 is patterned to form drain portions 201 that electrically contact drain metal strips 50 through drain vias 79 as shown. Hence, in response to the signal voltage applied to gate 40, a transistor current $I_D$ flowing through channels 77 is routed through drains 15, drain metal strips 50, vias 79 and drain portions 201 of interconnect layer 1030 to drain bumps 501 as shown.

In one embodiment, the distance between portions 101 and 201 is about two micrometers. Such a small distance enables maximized coverage and contact of underlying metal strips 50 and 55 to provide a low on-state resistance and a high performance device.

Figure 3:
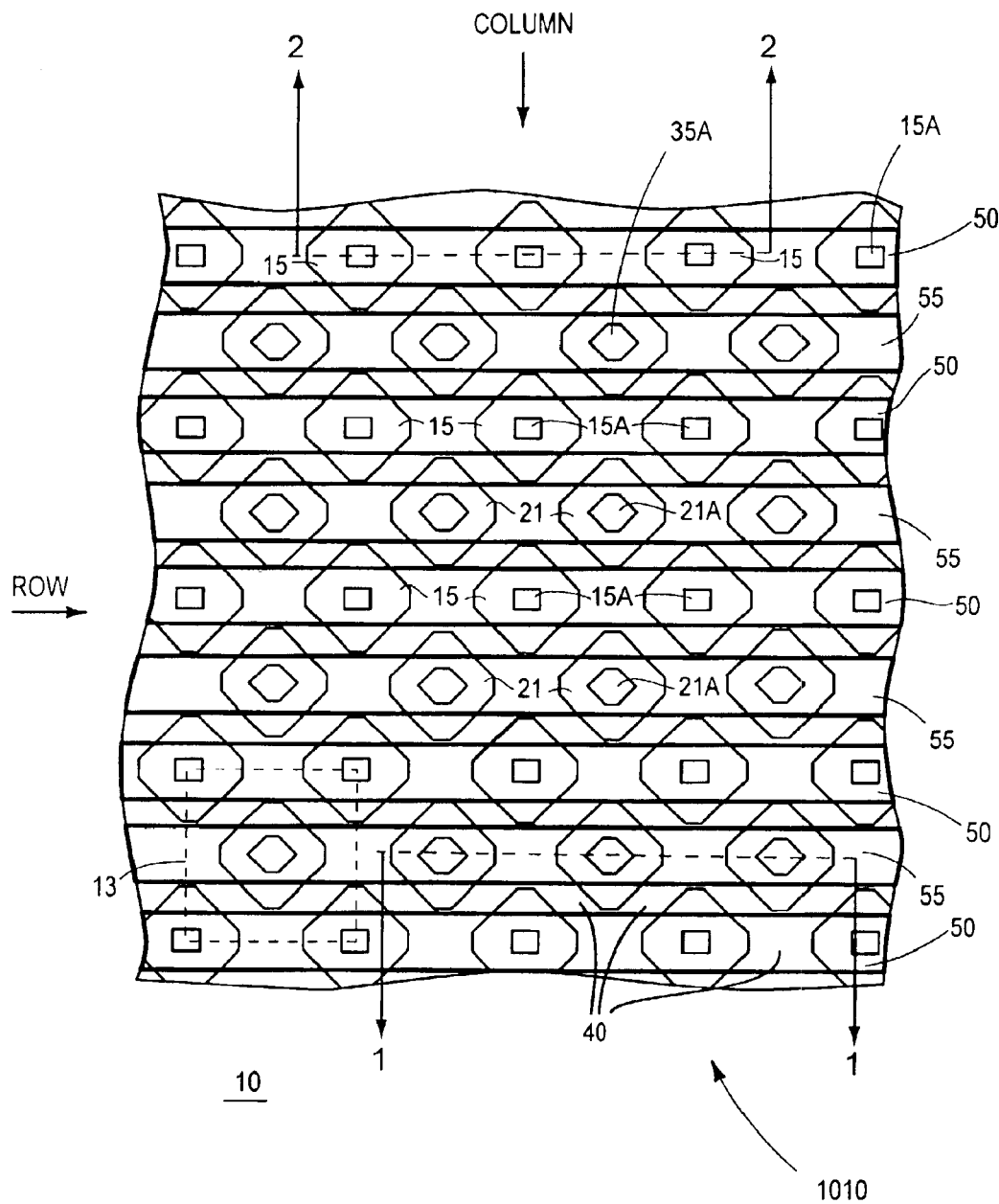
FIG. 3 is a top view of a portion of the transistor showing selected features.

FIG. 3 is a top view of a portion of transistor 10 showing selected features after a first stage of fabrication, including the arrangement of gate 40, sources 21 and drains 15 and their connection to drain and source metal strips 50 and 55, respectively, of metal layer 1010.

Sources 21 and drains 15 are self-aligned to gate 40 and arrayed in a matrix of rows and columns of transistor cells 13 as shown. In one embodiment, transistor cells 13 are shown as having the shape of rectangles, with centers at the centers of sources 21 and corners at the centers of adjacent drains 15 as shown. This configuration results in gate 40 having a web-like or mesh structure that defines the boundaries of sources 21 and drains 15.

Drains 15 are shown with drain contacts 15A of a rectangular shape, whereas sources 21 are shown as having source contacts 21A with a hexagonal shape. The hexagonal shape of source contacts 21A increases the contact size and allows both sources 21 and exposed portions of body regions 35 to be contacted by source metal strips 55 to maintain sources 21 and body regions 35 at the same potential.

Sources 21 are arranged in rows to facilitate electrically contact by source metal strips 55 that typically extend to the edges of the array of transistor cells 13. Drains 15 are arranged in alternate rows to facilitate electrically contact by drain metal strips 50 that also typically extend to the edges of the array of transistor cells 13. In one embodiment, transistor 10 is formed with about two thousand five hundred parallel-connected transistor cells 13 whose rows span a distance of about 1.48 millimeters and whose columns span a distance of about 1.48 millimeters. Because of the arrangement of sources 21 into rows that alternate with rows of drains 15, each source 21 is adjacent to four drains 15 and each drain 15 is adjacent to four sources 21, thereby providing a low on-state resistance. Furthermore, metal strips 50 and 55 are formed in alternating rows, such that drain metal strips 50 are adjacent to source metal strips 55, and vice-versa.

Figure 4:
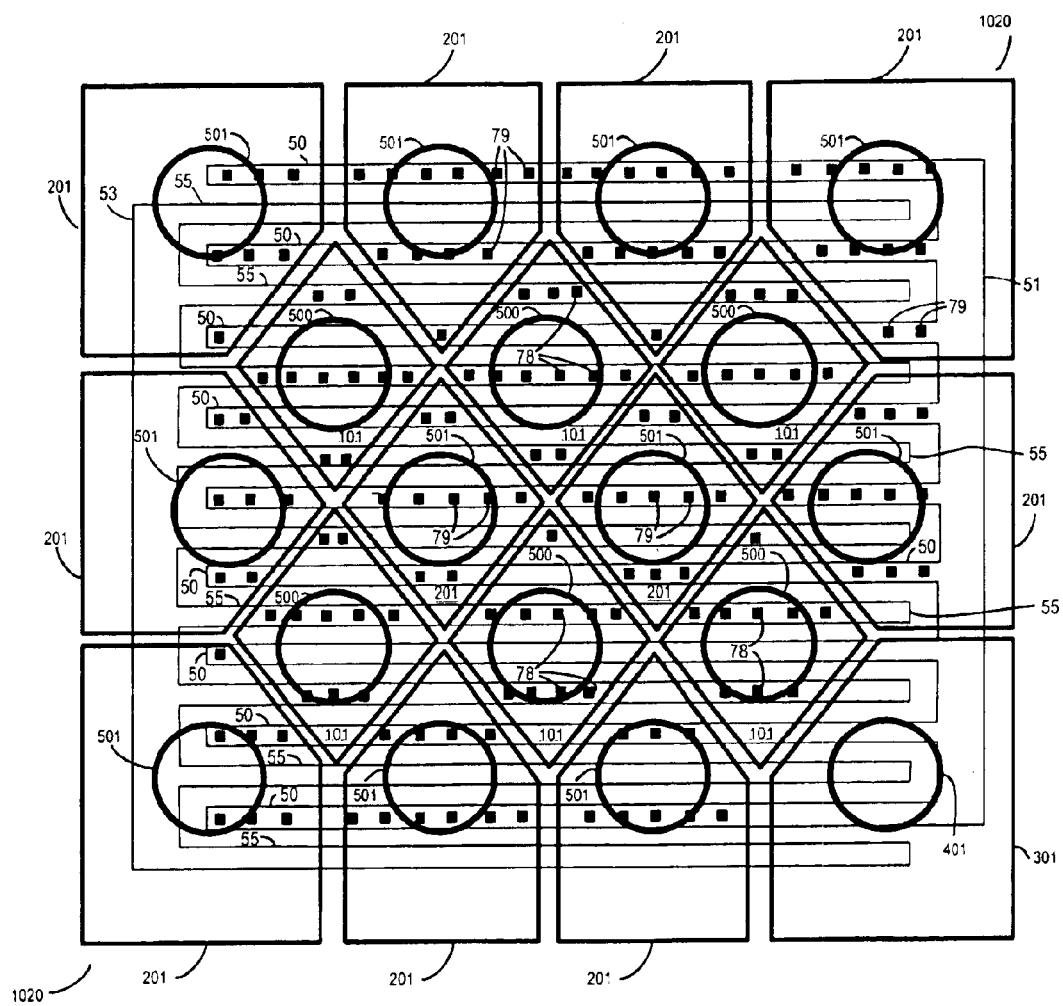
FIG. 4 is a top view of the transistor showing other selected features.

FIG. 4 is a top view of transistor 10 showing selected features including the arrangement of source and drain portions 101 and 201 of interconnect layer 1030, their electrical connection through vias 78 and 79 to source and drain metal strips 55 and 50 of metal layer 1010, and bumps 500 and 501. The number of source and drain portions 101 and 201 on a typical embodiment of transistor 10 ranges between about eight and about sixteen each. FIG. 4 shows a smaller number as well as a smaller number of source and drain metal strips 55 and 50 in order to simplify the description and more clearly describe the invention.

Metal layer 1010 is formed with two comblike regions 51 and 53 whose "teeth" include drain and source metal strips 50 and 55, respectively, which extend in an interleaved fashion as shown to electrically contact the alternating rows of drains 15 and sources 21.

In order to provide a small interconnect resistance component of transistor 10, the effective average current path through metal strips 50 and 55 is made short by forming interconnect layer 1030 as an array of rhomboid regions that overlie drain and source metal strips 50 and 55 as shown. The regions are designated as source and drain portions 101 and 201, respectively, as described above, and have a generally diamond or rhombus shape. A shorter path through metal strips 50 and 55 reduces the on-state resistance of transistor 10 because interconnect layer 1030 is made thicker than metal layer 1010. For example, in one embodiment, metal layer 1010 has a thickness of about 0.6 micrometers and interconnect layer 1030 has a thickness of about two micrometers. Hence, a current path through interconnect layer 1030 has a smaller resistance per unit length than a current path through metal layer 1010.

Source metal strips 55 electrically contact source portions 101 of interconnect layer 1030 through vias 78, while drain metal strips 50 electrically contact drain portions 201 of interconnect layer 1030 through vias 79. Hence, portions 101 and 201 electrically contact sources 21 and drains 15, respectively, of transistor 10.

Interconnect layer 1030 includes a gate portion 301 having an internal connection (not shown) to gate 40. A bump 401 is formed on gate portion 301 to provide for electrically connecting to gate 40 externally. In the interior portions of transistor 10, portions 101 and 201 are arranged in a checkerboard of alternating rows and columns so that source portions 101 are adjacent to four drain portions 201, and drain portions 201 are surrounded by four source portions 101. In one embodiment, the periphery 1020 of the transistor is formed primarily of drain portions 201 of interconnect layer 1030.

Note that each source portion 101 electrically contacts multiple underlying source metal strips 55 and therefore multiple underlying rows of sources 21. Therefore, the current path from a source 21 through its source metal strip 55 is shorter than the distance between adjacent vias 78 that underlie the associated source portion 101. Similarly, each drain portion 201 electrically contacts multiple underlying drain metal strips 50 and therefore multiple underlying rows of drains 15. Therefore, the current path from a drain 15 through its drain metal strip 50 is shorter than the distance between adjacent vias 79 under the associated drain portion 201.

Moreover, vias 78 and 79 are arranged to have the maximum density achievable with the fabrication process. As a result, each source portion 101 has multiple vias 78 contacting at least one, and preferably all, of the underlying source metal strips 55, while each drain portion 201 has multiple vias 79 contacting at least one, and preferably all, of the underlying drain metal strips 50. As a consequence of the high via density and the contact of portions 101 and 201 with multiple vias per metal strip, the length of a current path through metal layer 1010 from a source 21 underlying a drain portion 201 is less than one-half the width of the overlying drain portion 201 to one of the adjacent source portions 101. Similarly, the length of a current path through metal layer 1010 from a drain 15 underlying a source portion 101 is less than one-half the width of the source portion 101 to one of the adjacent drain portion 201. It is believed that this scheme minimizes the overall effective source to drain on-state resistance of transistor 10.

Furthermore, the checkerboard arrangement of the generally diamond-shaped portions 101 and 201 is scalable, so that if the size of the transistor 10 is increased, the size of portions 101 and 102 can remain the same and still provide short, localized source and drain current paths to achieve a low resistance.

Current gathered from sources 21 and drains 15 flows through source bumps 500 and drain bumps 501 to the external circuitry (not shown). In general, the collection of current from underlying metal strips by portions 101 and 201 increases in correlation with regions of increasing width. That is, the diamond shape of source and drain portions 101 and 201 of interconnect layer 1030 results in more vias being formed in the wider regions, so the effective resistance is lower in regions of higher current density. Hence, as the amount of current increases, correspondingly more metal is available to conduct the current, which results in a lower resistance. Moreover, portions 101 and 201 can be made large with respect to the underlying metal strips, so their ability to carry large currents is enhanced without having to add additional processing steps such as thick metal layers or the like.

The above described localized current flow through portions 101 and 201 of interconnect layer 1030 has a benefit of improving modeling precision during the design phase, even for large, high current power devices. The localized current flow results in a more accurate prediction of transistor performance which reduces the need to modify the device design, thereby reducing the design cycle and cost.

Figure 5:
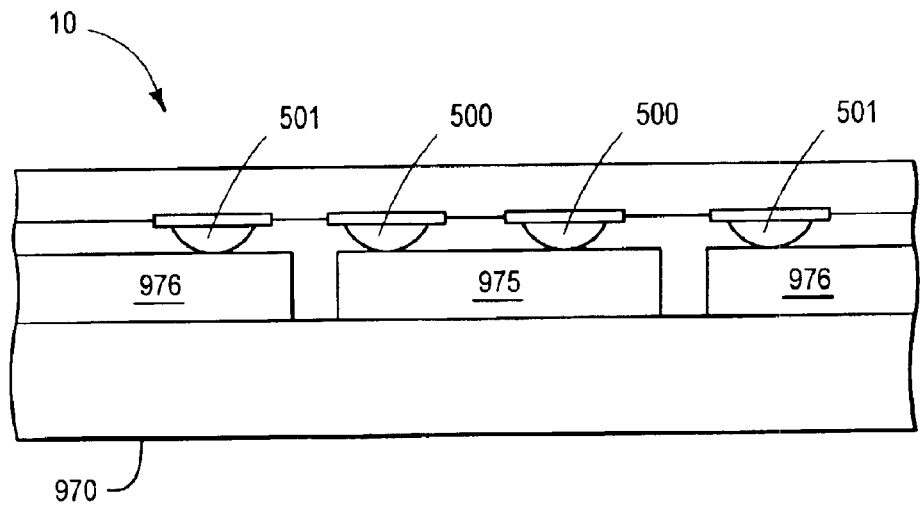
FIG. 5 is a cross-sectional view showing the transistor mounted to a circuit board.

FIG. 5 is a cross-sectional view showing selected features of an embodiment of transistor 10 as mounted and electrically coupled to a printed circuit board 970. Circuit board 970 comprises a circuit board structure with conductive traces 975 and 976 laminated on a standard dielectric base of glass-epoxy, FR4 or similar dielectric material. In one embodiment, traces 975-976 are formed with rolled copper having a thickness of about fifty micrometers.

The dimensions of source and drain portions 101 and 201 are selected for directly mounting to a circuit board. Hence, interconnect layer 1030 is configured to function as an interposer that accommodates both the relatively small dimensions of semiconductor substrate 12 and the relatively larger dimensions of circuit board 970. In one embodiment, the width (along a row) of source and drain portions 101 and 201 is about four hundred micrometers and the length (along a column) is about six hundred micrometers.

Transistor 10 is mounted in a flip-chip fashion to circuit board 970 with source bumps 500 electrically connecting source portions 101 to trace 975 by a solder reflow process, and drain bumps 501 electrically connecting drain portions 201 to traces 976. Trace 975 is shaped to connect all of the source bumps 500 to a first common node, and trace 976 is shaped to connect all of the drain bumps 501 to a second common node.

As a result, the localized currents flowing through the individual source and drain portions 101 and 201 of interconnect layer 1030 are further gathered by traces 975–976, which have a greater thickness than interconnect layer 1030. Hence, because localized currents flow for short distances through metal layer 1010, the overall on-state resistance of transistor 10 is lower than what is achievable with other devices.

Figure 6:
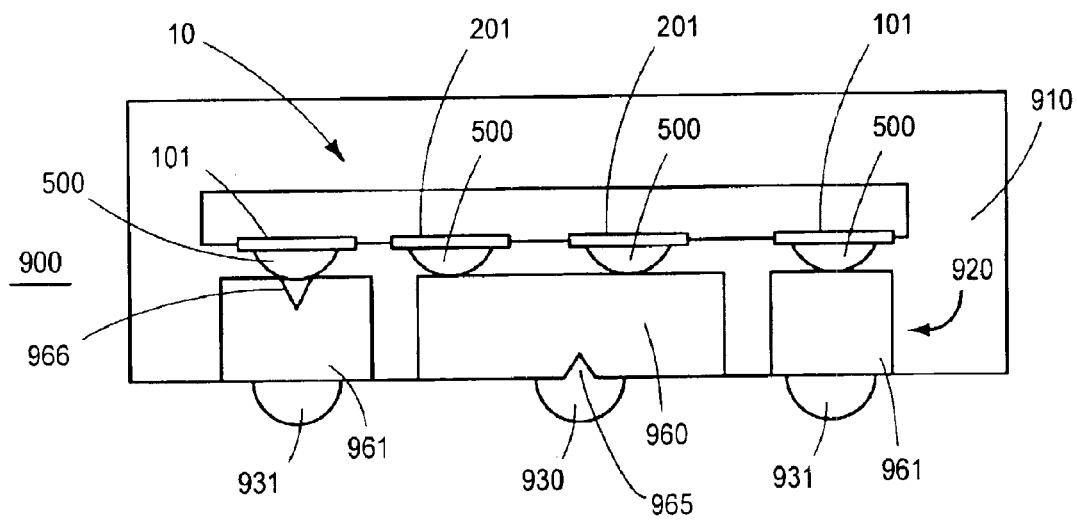
FIG. 6 is a cross-sectional view showing the transistor mounted to a leadframe and encapsulated to form a packaged semiconductor device.

FIG. 6 is a cross-sectional view showing transistor 10 mounted to a matrix leadframe 920 and overmolded with mold compound 910 to form a packaged semiconductor device 900 having external leads 930–931. Leadframe 920 includes a metal trace 960 for contacting source bumps 500 and a metal trace 961 for contacting drain bumps 501. Trace 960 is shaped to provide a common node to which are coupled all of the source portions 101 through source bumps 500. Trace 961 is shaped to provide a common node to which are coupled all of the drain portions 201 through drain bumps 501. Trace 960 appears as two separate traces in the view plane of FIG. 6, but the separate regions are coupled together out of the-view plane. Alternatively, the separate regions may be coupled together on a user's circuit board.

Leads 930–931 are formed with solder balls or another material such as plated copper that projects outwardly from leadframe 920. Alternatively, packaged semiconductor device 900 may be formed as a leadless device by omitting the solder balls and using external surfaces of traces 960–961 for making external connections. Detent 966 is formed in the internal horizontal surface of trace 961 to assist in orienting source bump 500. Detent 965 is formed in the lower external surface of trace 960 to assist in aligning lead 930 to trace 960. Additional detents may be readily included for the other regions of leadframe 920.

In summary, the present invention provides a semiconductor device or power transistor having a short current travel distance independent of transistor size that operates at a high current with low on-resistance and decreased power dissipation, which can be made with a simple sequence of processing steps to maintain a low manufacturing cost. A matrix of parallel-connected transistor cells is formed with drain metal strips for contacting drains of the transistor cells and source metal strips for contacting sources of the transistor cells. An interconnect layer overlying the matrix of transistor cells has a first portion that contacts one of the drain metal strips with first and second vias and a second portion that contacts one of the source metal strips with third and fourth vias.

What is claimed is:

1. A semiconductor device comprising:
   a matrix of transistor cells including drain metal strips for contacting drains of the transistor cells and source metal strips for contacting sources of the transistor cells; and
   an interconnect layer overlying the matrix of transistor cells and having first and second drain portions, each contacting one of the drain metal strips with multiple vias, and first and second source portions, each contacting one of the source metal strips with multiple vias.

2. The device of claim 1, wherein the multiple vias contacting each of the first and second drain portions are generally parallel to a line formed by the drain metal strips.

3. The device of claim 2, wherein the first and second drain portions and the first and second source portions are formed having a generally diamond shape.

4. The device of claim 3, wherein the first and second drain portions are adjacent to at least four source portions.

5. The device of claim 1, wherein the matrix of transistor cells includes a matrix of mesh gate LDMOS transistor cells.

6. The device of claim 1 wherein a first drain metal strip is formed between first and second source metal strips and a third source metal strip is formed between second and third drain metal strips.

7. The device of claim 1, wherein the interconnect layer includes eight source portions and eight drain portions.

8. The device of claim 1, wherein the source and drain metal strips are formed of a metal including aluminum.

9. The device of claim 8, wherein the interconnect layer is formed of aluminum or aluminum alloy.

10. The device of claim 1, further comprising:
    a first set of bumps formed on the first and second source portions of the interconnect layer for externally connecting to the sources of the transistor cells; and
    a second set of bumps formed on the first and second drain portions of the interconnect layer for externally connecting to the drains of the transistor cells.

11. The device of claim 1, further comprising a dielectric material separating the interconnect layer and the source and drain metal strips.

12. The device of claim 11, further comprising a package for housing the matrix of transistor cells and the interconnect layer.

13. A gate mesh LDMOS device comprising:
    an array of transistor cells including drain metal strips for contacting drains of the transistor cells and source metal strips for contacting sources of the transistor cells;
    an interconnect layer overlying the array of transistor cells and having first generally diamond shaped portions, each first generally diamond shaped portion having multiple vias for contacting one of the drain metal strips, and second generally diamond shaped portions, each second generally diamond shaped portion having multiple vias for contacting one of the source metal strips.

14. The gate mesh LDMOS device of claim 13, wherein the first and second generally diamond shaped portions are formed in a generally checkerboard array.

15. The gate mesh LDMOS device of claim 14, wherein the second generally diamond shaped portions are arranged to alternate with the first generally diamond shaped portions.

16. The gate mesh LDMOS device of claim 15, wherein the first and second generally diamond shaped portions contact all of the drain and source metal strips.

17. The gate mesh LDMOS device of claim 16, wherein the drain and source metal strips are arranged in alternating rows to electrically contact alternating rows of drains and sources.

18. The gate mesh LDMOS device of claim 17, further comprising:
    a dielectric layer separating the first and second generally diamond shaped portions; and
    a solder bump formed on each of the first and second generally diamond shaped portions for electrically contacting a circuit board trace or leadframe.

19. A semiconductor device comprising:
    a substrate formed having a plurality of transistor cells formed in first and second perpendicular directions;
    a first metal layer having first regions contacting sources of the transistor cells in the first perpendicular direction and second regions contacting drains of the transistor cells in the first perpendicular direction; and
    a second metal layer formed over the first metal layer and having first generally diamond shaped portions coupled to a plurality of source contacts in first and second perpendicular directions and second generally diamond shaped portions for contacting the plurality of drain contacts in first and second perpendicular directions.

20. The semiconductor device of claim 19, wherein the first and second portions of the first metal layer are formed of multiple parallel metal strips, alternating between contacting drains and sources.

* * * * *